United States Patent
Muthukumar et al.

(10) Patent No.: US 8,387,240 B2
(45) Date of Patent: Mar. 5, 2013

(54) METHODS FOR MAKING MULTI-CHIP PACKAGING USING AN INTERPOSER

(75) Inventors: Sriram Muthukumar, Chandler, AZ (US); Raul Mancera, Chandler, AZ (US); Yoshihiro Tomita, Ibaraki (JP); Chi-won Hwang, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 12/955,816

(22) Filed: Nov. 29, 2010

(65) Prior Publication Data

US 2011/0067236 A1 Mar. 24, 2011

Related U.S. Application Data

(62) Division of application No. 11/755,735, filed on May 30, 2007, now Pat. No. 7,841,080.

(51) Int. Cl.
*H01K 3/10* (2006.01)
(52) U.S. Cl. ............... 29/852; 29/832; 29/840; 174/260
(58) Field of Classification Search ............ 29/830–832, 29/840, 846, 852, 853; 174/260, 262; 438/108, 438/459, 667, 672; 257/476
See application file for complete search history.

(56) References Cited

U.S. PATENT DOCUMENTS

| | | | |
|---|---|---|---|
| 5,646,067 A | 7/1997 | Gaul | |
| 5,759,737 A | 6/1998 | Feilchenfeld et al. | |
| 6,376,769 B1 * | 4/2002 | Chung | 174/260 |
| 6,498,381 B2 | 12/2002 | Halahan et al. | |
| 6,848,177 B2 | 2/2005 | Swan et al. | |
| 6,908,845 B2 | 6/2005 | Swan et al. | |
| 6,979,644 B2 | 12/2005 | Omote et al. | |
| 7,049,170 B2 * | 5/2006 | Savastiouk et al. | 438/108 |
| 7,049,208 B2 | 5/2006 | Muthukumar et al. | |
| 7,410,884 B2 | 8/2008 | Ramanathan et al. | |
| 7,841,080 B2 | 11/2010 | Muthukumar et al. | |
| 2003/0047809 A1 | 3/2003 | Takeuchi et al. | |
| 2003/0081389 A1 | 5/2003 | Nair et al. | |
| 2003/0200654 A1 | 10/2003 | Omote et al. | |
| 2004/0229400 A1 | 11/2004 | Chua et al. | |
| 2007/0029106 A1 | 2/2007 | Kato | |
| 2007/0117348 A1 | 5/2007 | Ramanathan et al. | |
| 2008/0295329 A1 | 12/2008 | Muthukumar et al. | |

OTHER PUBLICATIONS

Andry et al., "A CMOS-compatible Process for Fabricating Electrical Through-vias in Silicon", IBM Corporation, 56th Electronic Components & Technology Conference, San Diego, USA, 2006, pp. 831-837.

Newman et al., "Fabrication and Electrical Characterization of 3D Vertical Interconnects", Intel Corporation, 56th Electronic Components & Technology Conference, San Diego, USA, 2006, pp. 394-398.

* cited by examiner

*Primary Examiner* — Donghai D. Nguyen
(74) *Attorney, Agent, or Firm* — Konrad Raynes Davda & Victor LLP; Alan S. Raynes

(57) ABSTRACT

In one embodiment, a method includes forming a plurality of vias partially through a body, the vias including sidewalls defined by the body. An electrically insulating layer is formed on the sidewalls and on an upper surface of the body. An electrically conductive layer is formed on the insulating layer in the vias and on the upper surface, the electrically conductive layer defining first metal pads on the upper surface and second metal pads in contact with the first metal pads, the second metal pads having a denser pitch than the first metal pads. A dielectric layer is formed between adjacent first metal pads and between adjacent second metal pads. The body is thinned through a lower surface and the electrically insulating layer in the vias is exposed. After the thinning, a portion of the electrically insulating layer in the, vias is removed. The body is coupled to a substrate.

20 Claims, 4 Drawing Sheets

METHODS FOR MAKING MULTI-CHIP PACKAGING USING AN INTERPOSER

This application is a divisional of U.S. patent application Ser. No. 11/755,735 U.S. Pat. No. 7,841,080 filed May 30, 2007, which is hereby incorporated by reference in its entirety.

BACKGROUND

As performance increases and electronic device sizes decrease, problems relating to the connections between a die and substrate have developed. For example, such problems may relate to the scaling of interconnects on the die and on the substrate, and to meeting performance requirements for power delivery and memory input/output bandwidth.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic device assemblies and methods for their manufacture. Embodiments may include the use of an interposer between multiple die structures and a substrate.

Figure 1:
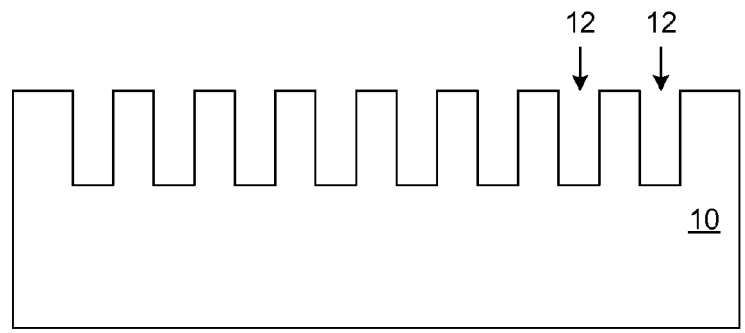
FIG. 1 illustrates a body having a plurality of vias formed partially therethrough, in accordance with certain embodiments.

FIG. 1 illustrates an embodiment including a body 10 such as an interposer formed from a material including, but not limited to, a semiconductor such as silicon. The body 10 may be an individual interposer or a wafer that will be formed into individual interposers during subsequent processing operations. A plurality of vias 12 are formed to extend partially through the body 10. The vias 12 are formed prior to coupling any die structures to the interposer body 10. The vias 12 may be formed using any suitable method, for example, deep reactive ion etching (DRIE). A typical DRIE rate is about 5 microns per minute. In certain embodiments, the interposer body 10 may have a thickness of about 500-1000 microns and the vias 12 may be formed to a depth of up to about 200-300 microns and a diameter of about 20-90 microns. Depending on the form factor requirements of the final device, after processing, the interposer body 10 may in certain embodiments be formed into an interposer having a silicon thickness in the range of about 50-300 microns. Embodiments may also have different dimensions and geometries.

Figure 2:
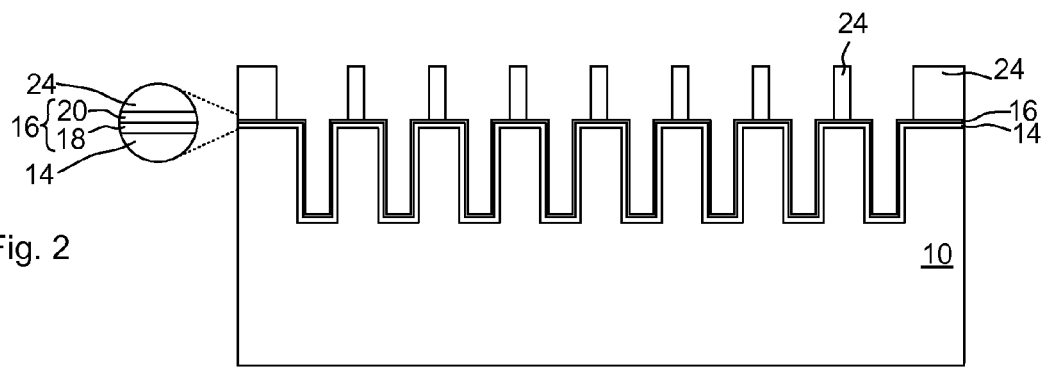
FIG. 2 illustrates the formation of various layers in vias and on a body, in accordance with certain embodiments.

FIG. 2 illustrates the formation of several layers on the body 10 on the surfaces defining the vias 12 and on the upper surface of the body 10 adjacent to the vias. As used herein, terms such as upper and lower are used in connection with the orientation of the elements as shown in the Figures.

When the interposer body 10 is formed from silicon, an electrically insulating layer 14, such as an oxide layer, is formed on the surfaces defining the vias 12 and on the upper surface of the interposer body 10. The electrically insulating layer 14 may be formed using any suitable method, for example, oxidation. The vias 12 will also be coated with an electrically conductive material. The electrically conductive materials extending vertically through the vias will act as a vertical interconnection through the interposer body 10. In certain embodiments the vertical interconnections are formed at the same interconnection pitch as is used on the substrate to which the body will be attached (e.g., as an interposer between functional die structures and the substrate).

Figure 3:
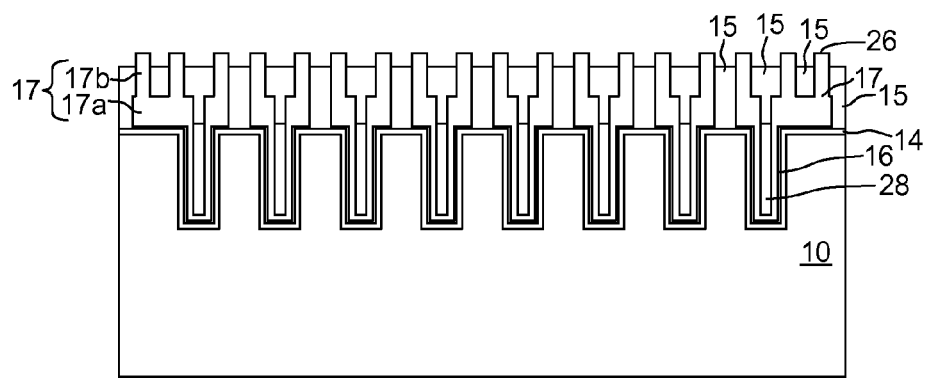
FIG. 3 illustrates the formation of metal and dielectric layers on a body, in accordance with certain embodiments.

A layer 16 may be formed on the electrically insulating layer 14. The layer 16 may be formed from one or more layers such as an interfacial layer 18 and seed layer 20, as illustrated in the blown up portion of FIG. 2. The interfacial layer 18 and the seed layer 20 are positioned between the electrically insulating layer 14 and an electrically conductive layer 17, which is illustrated in FIG. 3. Examples of interfacial layer 18 materials include, but are not limited to, tantalum (Ta), titanium (Ti), and titanium nitride (TiN). The interfacial layer 18 may act to promote adhesion of the insulation layer 14 to subsequently deposited materials. Examples of seed layer 20 materials include, but are not limited to, copper (Cu) and gold (Au). Examples of electrically conductive layer 17 materials include, but are not limited to, metals such as copper, tungsten (W), silver (Ag), and gold. The term metal as used herein includes pure metals and alloys. The interfacial and seed layers may be deposited using any suitable method, for example, chemical vapor deposition (CVD) and physical vapor deposition (PVD). The electrically conductive layer 17 may also be deposited using any suitable method, for example, plating. A typical plating rate is about 0.5 microns per minute. A mask layer 24 may be utilized if desired, for example, prior to the formation of the electrically conductive layer 17. The mask 24 may be used during subsequent deposition operations as well. Any suitable mask, for example, a photoresist mask, may be used.

FIG. 3 illustrates the formation of the electrically conductive layer 17 in electrical contact with the layer 16. FIG. 3 also illustrates the formation of dielectric material 15 positioned between the electric paths defined by the electrically conductive layer 17. The electrically conductive layer 17 and dielectric material 15 may be formed using any suitable CMOS processing methods. The dielectric material 15 may be formed from electrically insulating materials including, but not limited to, oxides and polymers. The dielectric material 15 seals off a gap 28 in the vias 12. As illustrated in FIG. 3, the sides and bottom of the gap 28 are bounded by the electrically conductive layer 17, and the top of the gap 28 is bounded by the dielectric material 15.

The electrically conductive layer 17 may be formed using build-up layers that define multiple paths as the electrically conductive layer 17 extends into the vias. For example, as illustrated in FIG. 3, an portion of the electrically conductive layer 17 formed on the upper surface of the body 10 may be a first metal pad layer 17a formed to have a first pitch, and another portion of the electrically conductive layer 17 may be a second metal pad layer 17b formed on the first metal pad layer, the second pad layer having a denser pitch than the first metal pad layer. The second pad layer portion 17b of electrically conductive layer 17 includes upper portions that may act as interconnection contacts 26 to be used for coupling to other elements having a different pitch than that of vertical interconnects extending through the vias 12. Portions of the layer 16 between the first metal pad regions 17a may be removed by a suitable process such as etching. Thus, the interconnection pitch of the contacts 26 may be controlled to equal the interconnection pitch on an element to which it will be connected, even if the element has a denser pitch than that of the vertical interconnects through the vias 12. A single electrical interconnect contact at a lower portion of the via 12 may be electrically coupled through the vertical interconnect of the conductive material in the via 12 to a plurality of electrical interconnect contacts 26. While first and second upper pad layers 17a and 17b are illustrated and described above, it is of course understood that additional pad layers may be present.

Figure 4A:
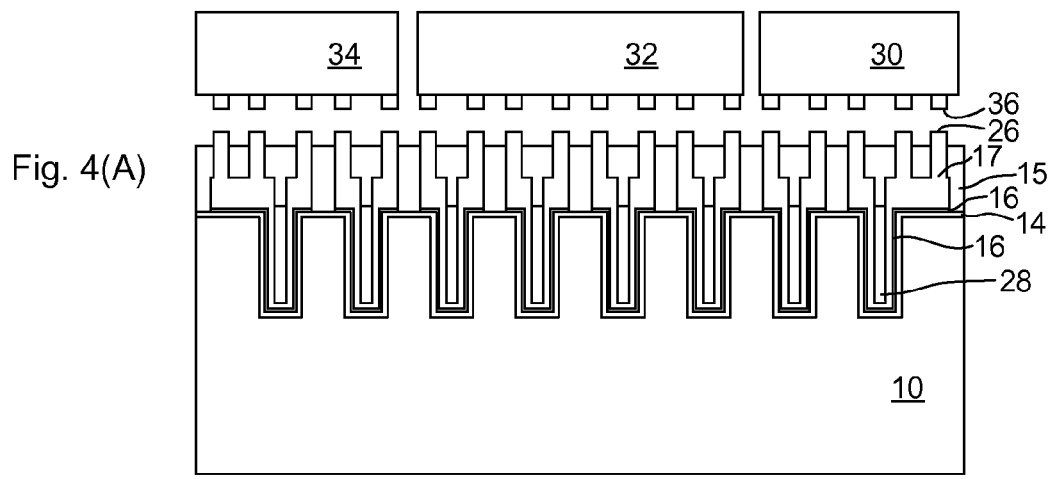
FIGS. 4(A)-4(C) illustrate coupling elements to a body and thinning the body, with FIG. 4(A) illustrating positioning a plurality of elements adjacent to the body, FIG. 4(B) illustrating coupling the elements to the body, and FIG. 4(C) illustrating thinning the body, in accordance with certain embodiments.
Figure 4B:
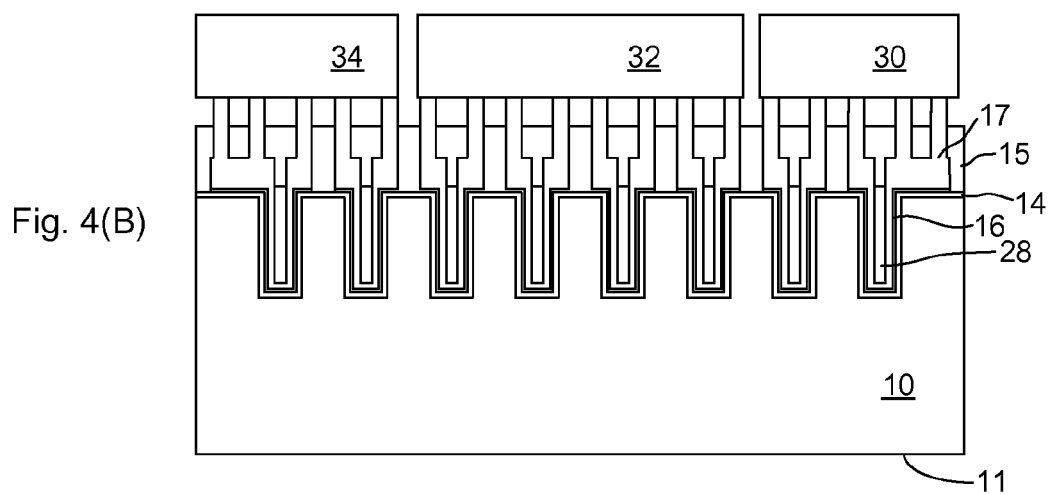
Figure 4C:
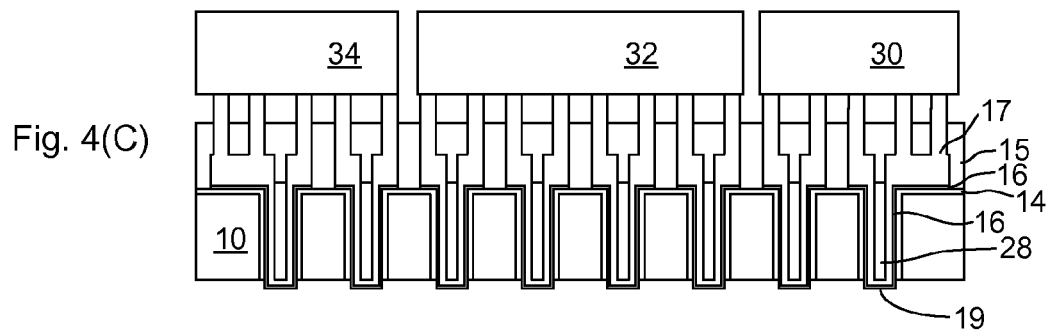

FIGS. 4(A)-4(C) relate to an assembly option in which a plurality of elements such as die structures are coupled to the interposer body 10 and then the interposer body 10 is thinned. The die structures may be multi-functional die structures including, but not limited to one or more of a central processing unit (CPU), graphical processing unit (GPU), various types of memory, including, but not limited to, dynamic random access memory (DRAM), and voltage regulators. As illustrated in FIG. 4(A), a plurality of die structures 30, 32, 34 are brought into position adjacent to the interposer body 10. The die structures 30, 32, 34 may in certain embodiments be the same height and may each contain a plurality of interconnection contacts 36, such as C4 interconnections, positioned adjacent to contacts 26 on the interposer body 10. The die structures 30, 32, 34 may be flip-chip mounted to the contacts 26 on the interposer body 10 using a suitable method including, but not limited to, solder reflow or thermo-compression bonding (TCB). Factors which may affect joint function may include pressure, temperature, time, and the materials used. After the die structures 30, 32, 34 are coupled to the interposer body 10 (FIG. 4(B)), the interposer body 10 may be thinned from the lower surface 11. The thinning may be carried out using any suitable method, for example, chemical mechanical polishing (CMP). Once the electrically insulating layer 14 at the bottom of the via 12 is reached, the CMP may be stopped and then the insulating layer 14 may be etched. Additional etching of a portion of the other layers (for example, layer 18) may also be performed, if desired. As illustrated in FIG. 4(C), a lower portion 19 of the electrically conductive materials formed in the via may act as a bonding pad to be coupled to a substrate. In certain embodiments the thickness of the electrically conductive layer 17 at the lower portion 19 is formed to be about 30 microns thick. If the body 10 is a wafer, the wafer may, if desired, at this time, be diced into individual interposers having the die structures coupled thereon.

Figure 5A:
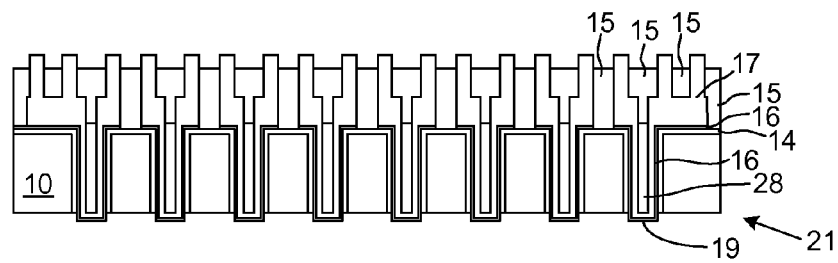
FIG. 5(A)-5(B) illustrate thinning a body and coupling elements thereto, with FIG. 5(A) illustrating thinning the body and FIG. 5(B) illustrating coupling the elements thereto, in accordance with certain embodiments.
Figure 5B:
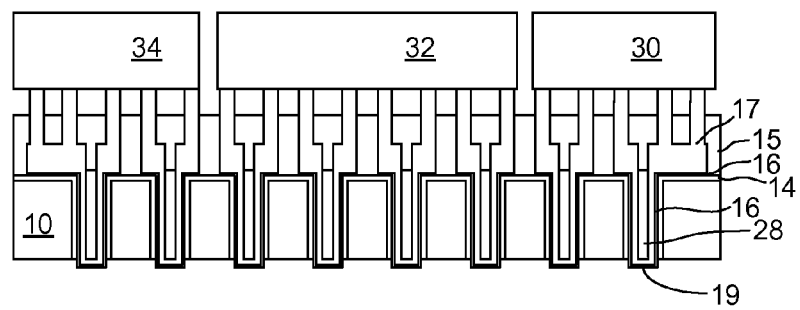

FIGS. 5(A)-5(B) relate to an assembly option in which the interposer body 10 is thinned prior to coupling a plurality of die structures 30, 32, 34 thereto. As illustrated in FIG. 5(A) the interposer body 10 is thinned as described above in connection with FIG. 4(C), so that a lower portion 19 of the electrically conductive materials formed in the via is exposed. After thinning the interposer body 10, if in the form of a wafer, it may then be diced into a plurality of a completed interposers 21. As illustrated in FIG. 5(B), the die structures 30, 32, 34 may then be coupled to the interposer 21 through the contacts 26 at the upper portions of the electrically conductive layer 17.

Figure 6:
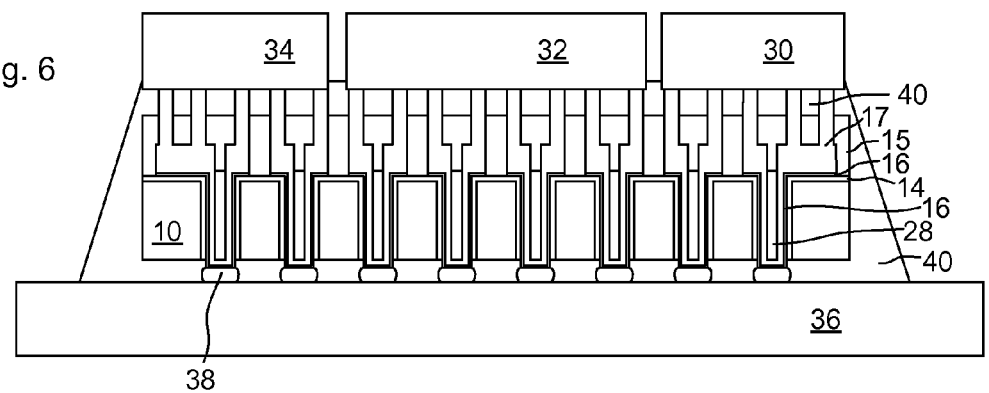
FIG. 6 illustrates attaching a body having elements coupled thereto to a substrate, in accordance with certain embodiments.
Figure 7:
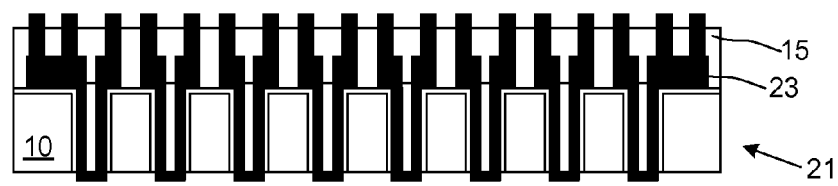
FIG. 7 illustrates the electrical path through a body, in accordance with certain embodiments.

FIG. 6 illustrates the attachment of the interposer 21 and die structures 30, 32, 34 to a substrate 36. The substrate 36 may in certain embodiments be a package substrate and/or a motherboard having C4 interconnection contacts thereon. The substrate may be formed from materials including, but not limited to, polymer and ceramic materials. A suitable processing technique such as a flip-chip assembly may be used, with the bump bonding connections 38 coupled to the lower portions 19 of the electrically conductive layer 16 using a suitable method. A suitable underfill material 40 may be positioned around and between the two-layer stack of the interposer 21 and the die structures 30, 32, 34 on the substrate 36. An example of a suitable underfill material 40 is a polymer epoxy. The underfill material 40 may be dispensed using a suitable method including, but not limited to, capillary dispense, lamination, spin dispense, and jet dispense. FIG. 7 illustrates the electrical path 23, which is shaded, extending through the interposer 21.

Figure 8:
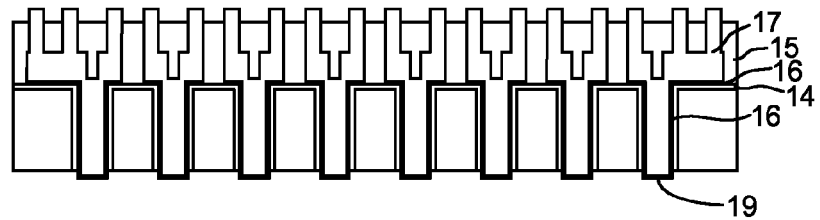
FIG. 8 illustrates a body having a plurality of vias extending therethrough, in which the vias are filled and no gap is present, in accordance with certain embodiments.

FIG. 8 illustrates an embodiment illustrating an interposer in which there is no gap in the vias. The electrically conductive layer 17 is formed to fill the via and leave no gap 28 as in the embodiment illustrated in FIG. 5(A), for example. Depending on issues including, but not necessarily limited to, the material used to fill the vias, the filling technique, the geometry, and the aspect ratio of the vias, embodiments may utilize either a partially filled vias (for example, the sidewalls coated and a central section not filled), or a vias filled as completely as possible.

Figure 9:
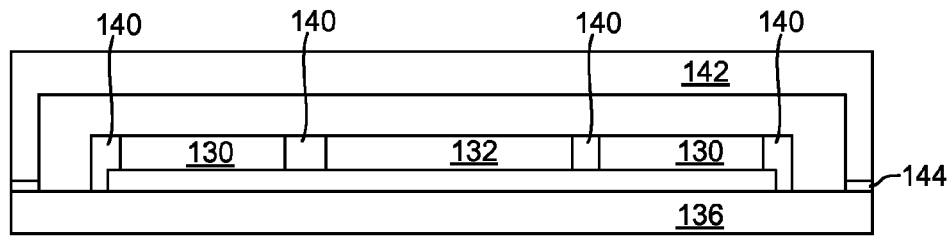
FIG. 9 illustrates an assembly including a plurality of die structures coupled to an interposer body and coupled to a substrate, with a lid also coupled to the substrate, formed in accordance with certain embodiments.

FIG. 9 illustrates an assembly including a plurality of die structures 130, 132, 134 coupled to an interposer 121 which is coupled to a substrate 136, in accordance with an embodiment such as described above. A lid is also coupled to the substrate 136. The lid 144 may act to protect the die structures 130, 132, 134 from damage and may be used for thermal management. An underfill material 140 may be positioned between the substrate 136 and interposer 121 and between the interposer 121 and the die structures 130, 132, 134.

Figure 10:
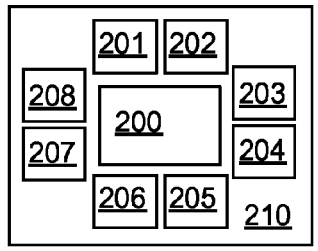
FIGS. 10-12 illustrate views of device layouts such as a CPU surrounded by a plurality of elements, which may be formed in accordance with certain embodiments.
Figure 11:
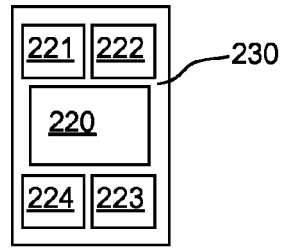
Figure 12:
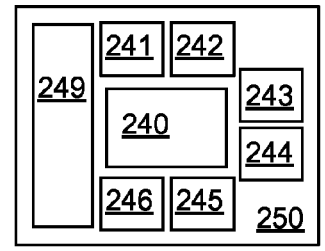

FIGS. 10-12 illustrate views of device layouts including a die structure or element surrounded by a plurality of other die structures or other elements. For example, as illustrated in FIG. 10, the central element 200 may be a central processing unit (CPU) die surrounded by a plurality of memory die elements 201-208. As illustrated in FIG. 11, the device layout includes a central element 220 that may be a CPU, surrounded by a plurality of elements 221-224, which may be DRAM elements. As illustrated in FIG. 12, the device layout includes a central element 240 that may be a CPU, surrounded by a plurality of similar elements 241-246, for example, DRAM elements, and an element 247 that may, for example, be an integrated silicon voltage regulator (ISVR) element. Other types of elements may also be used. The central element surrounded by a plurality of elements may be coupled to an interposer and substrate using processes such as described in embodiments described above. Such a three-dimensional layout using the interposer and multiple die elements coupled thereto may lead to one or more advantages such as fine pitch interconnections and shorter paths for power delivery and for input/output communication between the die elements. It should be appreciated that a large number of other layouts with different elements may also be formed in accordance with certain embodiments.

Assemblies as described in embodiments above may find application in a variety of electronic components. In certain embodiments, a device or devices in accordance with the present description may be embodied in a computer system including a video controller to render information to display on a monitor coupled to the computer. The computer system may comprise one or more of a desktop, workstation, server, mainframe, laptop, handheld computer, handheld gaming device, handheld entertainment device (for example, a video player), PDA (personal digital assistant), telephony device (wireless or wired), etc. Alternatively, a device or devices in accordance with the present description may be embodied in a computing device that does not include a video controller, such as a switch, router, etc.

Figure 13:
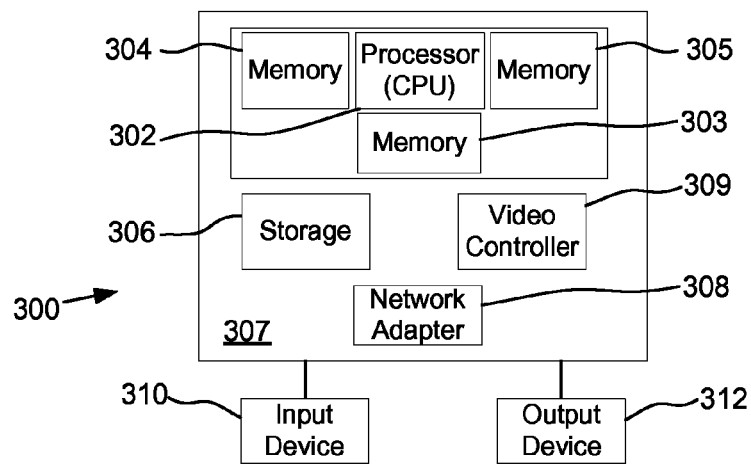
FIG. 13 is an electronic system arrangement in which certain embodiments may find application.

FIG. 13 schematically illustrates one example of an electronic system environment in which aspects of described embodiments may be embodied. Other embodiments need not include all of the features specified in FIG. 13, and may include alternative features not specified in FIG. 13. FIG. 13 illustrates an embodiment of a device including a computer architecture 300 which may utilize integrated circuit devices having a structure including capacitors formed in accordance with embodiments as described above. The architecture 300 may include a CPU 302, memory 303, 304, 305, and storage 306. The CPU 302 may be coupled to a printed circuit board 307, which may be a motherboard. The CPU 302 and the memory 303, 304, 305 is an example of an assembly formed in accordance with the embodiments described above and illustrated in the Figures. One or more of the other components illustrated in FIG. 13 may also be formed as part of the same assembly as the CPU 302 and memory 303, 304, 305. Alternatively, other combinations of the system components may also be formed in accordance with the embodiments described above. The system components may be formed on the motherboard, or may be disposed on other cards such as daughter cards or expansion cards.

The storage 306 may comprise an internal storage device or an attached or network accessible storage. Programs in the storage 306 may be loaded into the memory 303, 304, 305 and be executed by the CPU 302 in a manner known in the art. The architecture may further include a network controller 308 to enable communication with a network, such as an Ethernet, a Fibre Channel Arbitrated Loop, etc. Further, the architecture may, in certain embodiments, also include a video controller 309, to render information on a display monitor, where the video controller may be embodied on a video card or integrated on integrated circuit components mounted on the motherboard, for example. Other controllers may also be present to control other devices.

An input device 310 may be used to provide input to the CPU 302, and may include, for example, a keyboard, mouse, pen-stylus, microphone, touch sensitive display screen, or any other suitable activation or input mechanism. An output device 312 including, for example, a monitor, printer, speaker, etc., capable of rendering information transmitted from the CPU 302 or other component, may also be present.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A method comprising:
    forming a plurality of vias extending partially through a body, the vias including sidewalls defined by the body;
    forming an electrically insulating layer on the sidewalls in the vias and on an upper surface of the body;
    forming an electrically conductive layer on the electrically insulating layer in the vias and on the upper surface, the electrically conductive layer defining first metal pads on the upper surface and second metal pads in contact with the first metal pads, the second metal pads having a denser pitch between adjacent pads than the first metal pads;
    forming a dielectric layer between the adjacent first metal pads and forming a dielectric layer between the adjacent second metal pads, wherein at least one of the vias is covered by a portion of the dielectric layer between adjacent first metal pads
    thinning the body through a lower surface and exposing the electrically insulating layer in the vias;
    after the thinning the body, coupling a plurality of electronic elements to the second metal pads;
    removing a portion of the electrically insulating layer in the vias; and
    coupling body to a substrate, wherein the body is positioned between the electronic elements and the substrate.

2. The method of claim 1, wherein the body comprises silicon, the electronic elements comprise silicon die structures, and wherein the electronic elements are flip-chip coupled to the second metal pads on the body.

3. The method of claim 1, further comprising forming at least one of an interfacial layer and a seed layer between the electrically insulating layer and the electrically conductive layer.

4. The method of claim 1, wherein a interfacial layer is formed directly on the electrically insulating layer, a metal seed layer is formed directly on the interfacial layer, and the electrically conductive layer is formed directly on the metal seed layer using a plating method.

5. The method of claim 1, wherein the body comprises a wafer, and after the thinning the silicon body and prior to the coupling the electronic elements, dicing the wafer into individual interposers.

6. The method of claim 1, further comprising coupling a lid to the substrate after the coupling the exposed electrically conductive layer to the substrate, wherein the lid is positioned to cover the electronic elements.

7. The method of claim 1, wherein the electronic elements include at least one electronic element selected from the group consisting of a central processing unit, a plurality of memory elements, and an integrated silicon voltage regulator.

8. A method comprising:
    forming a plurality of vias extending partially through a body, the vias including sidewalls defined by the body;
    forming an electrically insulating layer on the sidewalls in the vias and on an upper surface of the body;
    forming an electrically conductive layer on the electrically insulating layer in the vias and on the upper surface, the electrically conductive layer defining first metal pads on the upper surface and second metal pads in contact with the first metal pads, the first metal pads positioned at a level between that of the vias and the second metal pads, wherein at least two first metal pads are electrically coupled to each via, wherein the electrically conductive layer is formed to include more second metal pads than first metal pads;

forming a dielectric layer between the adjacent first metal pads and forming a dielectric layer between the adjacent second metal pads;

thinning the body through a lower surface and exposing the electrically insulating layer in the vias;

after the thinning the body, coupling a plurality of electronic elements to the second metal pads;

removing a portion of the electrically insulating layer in the vias; and coupling body to a substrate, wherein the body is positioned between the electronic elements and the substrate.

9. The method of claim 8, wherein the body comprises silicon, the electronic elements comprise silicon die structures, and wherein the electronic elements are flip-chip coupled to the second metal pads on the body.

10. The method of claim 8, further comprising forming at least one of an interfacial layer and a seed layer between the electrically insulating layer and the electrically conductive layer.

11. The method of claim 8, wherein a interfacial layer is formed directly on the electrically insulating layer, a metal seed layer is formed directly on the interfacial layer, and the electrically conductive layer is formed directly on the metal seed layer using a plating method.

12. The method of claim 8, wherein the body comprises a wafer, and after the thinning the silicon body and prior to the coupling the electronic elements, dicing the wafer into individual interposers.

13. The method of claim 8, further comprising coupling a lid to the substrate after the coupling the exposed electrically conductive layer to the substrate, wherein the lid is positioned to cover the electronic elements.

14. The method of claim 8, wherein the electronic elements include at least one electronic element selected from the group consisting of a central processing unit, a plurality of memory elements, and an integrated silicon voltage regulator.

15. The method of claim 8, wherein each of the vias is covered by a portion of the dielectric layer between adjacent first metal pads.

16. A method comprising:

forming a plurality of vias extending partially through a body, the vias including sidewalls defined by the body;

forming an electrically insulating layer on the sidewalls in the vias and on an upper surface of the body;

forming an electrically conductive layer on the electrically insulating layer in the vias and on the upper surface, the electrically conductive layer defining first metal pads on the upper surface and second metal pads in contact with the first metal pads, the first metal pads positioned at a level between that of the vias and the second metal pads, wherein the electrically conductive layer is formed to include more second metal pads than first metal pads;

forming a dielectric layer between the adjacent first metal pads and forming a dielectric layer between the adjacent second metal pads;

wherein the electrically conductive layer and the dielectric layer are formed so that a gap remains in each of the vias, the gap defined by the electrically conductive layer in the vias and a portion of the dielectric layer between the adjacent first metal pads;

thinning the body through a lower surface and exposing the electrically insulating layer in the vias;

after the thinning the body, coupling a plurality of electronic elements to the second metal pad layer;

removing a portion of the electrically insulating layer in the vias; and coupling body to a substrate, wherein the body is positioned between the electronic elements and the substrate.

17. The method of claim 16, wherein the body comprises silicon, the electronic elements comprise silicon die structures, and wherein the electronic elements are flip-chip coupled to the second metal pads on the body.

18. The method of claim 16, further comprising forming at least one of an interfacial layer and a seed layer between the electrically insulating layer and the electrically conductive layer.

19. The method of claim 16, wherein the electronic elements include at least one electronic element selected from the group consisting of a central processing unit, a plurality of memory elements, and an integrated silicon voltage regulator.

20. The method of claim 16, wherein the electrically conductive layer is formed so that at least two first metal pads are electrically coupled to each via.

* * * * *